United States Patent [19]

Schlichte

[11] 3,911,427

[45] Oct. 7, 1975

[54] DIGITAL-TO-ANALOG CONVERTER

[75] Inventor: Max Schlichte, Munich, Germany

[73] Assignee: Siemens Aktiengesellschaft, Munich, Germany

[22] Filed: Mar. 28, 1974

[21] Appl. No.: 455,663

[30] Foreign Application Priority Data

Mar. 30, 1973 Germany............................ 2315987

[52] U.S. Cl...................... 340/347 DA; 340/347 AD

[51] Int. Cl.$^2$.......................................... H03K 13/02

[58] Field of Search .............. 340/347 AD, 347 DA; 328/119; 332/11; 375/38 R

[56] References Cited

UNITED STATES PATENTS

| | | | |
|---|---|---|---|
| 2,451,044 | 10/1948 | Pierce | 340/347 AD X |
| 2,514,671 | 7/1950 | Rack | 340/347 AD X |
| 2,801,281 | 7/1957 | Oliver et al. | 340/347 AD X |
| 3,112,477 | 11/1963 | Vogelsong | 340/347 AD |

OTHER PUBLICATIONS

Schmid "Electronic Analog/Digital Converters 1970, pp. 188–191.

*Primary Examiner*—Charles D. Miller

*Attorney, Agent, or Firm*—Schuyler, Birch, Swindler, McKie & Beckett

[57] ABSTRACT

A digital-to-analog converter is described. To achieve a non-linear characteristic as recommended by the CCITT, the bits of a digital signal being converted are routed, according to their significance, to appropriate register stages of a shift register. The shift register controls a Shannon decoder at the output. The Shannon decoder and the shift register are controlled by a shared pulse-control means. The invention is more particularly employed in an analog-to-digital coder operating according to the iterative process.

7 Claims, 2 Drawing Figures

DIGITAL-TO-ANALOG CONVERTER

BACKGROUND OF THE INVENTION

A commonly used technique for the conversion of digital signals comprising $n + m + 1$ bits each to analog signals (West German Unexamined Pat. No. 2,011,056) employs a digital-to-analog converter with a non-linear characteristic consisting of $2^{m+1}$linear segments with $2^n$ amplitude stages each. This digital-to-analog converter comprises a first decoder circuit element, a second decoder circuit element, and a third decoder circuit element.

The first decoder circuit element converts the n least significant bits of the digital signal in a resistor-ladder network having resistors that are adequate for a binary staggering of values to an analog control signal for the second decoder circuit element. Still another resistor can be made operative in the resistor network in the event that at least one bit of the m bits of the digital signal immediately preceding the n bits in significance is formed by a binary 1.

The second decoder circuit element comprises a resistor-ladder network having resistors that are adequate for a binary staggering of values, which resistors can be made operative according to the value of the binary 1 bits of the digital signal and by which said control signal is affected accordingly.

In the third decoder circuit element, the polarity of an output signal being transmitted from the second decoder circuit element to a decoder output is determined by the remaining one bit of the digital signal. Although with the aid of the prior art digital-to-analog converter a conversion of digital signals to analog signals occurs through the use of a particular characteristic, such as frequently employed for PCM coders and PCM decoders (contrast with COM XV, question 33 Temp. Doc. No. 34 of Sept. 25 to Oct. 6, 1967, published by the CCITT), the construction of the first and second decoder circuit element is relatively complex.

Another known technique uses a Shannon decoder ("Der Fernmelde-Ingenieur," 19th Volume, No. 8 of Aug. 15, 1965, pp. 19 ff) for decoding a pulse-code modulated signal. The Shannon decoder includes a capacitor and an RC network containing a resistor connected in parallel therewith, to which current pulses are fed for charging the capacitor if the pulse-code modulated signals appearing sequentially are each formed by a binary 1. The discharge time constant of the RC network is so selected that the voltage applied across the capacitor drops to half its respective initial value within the period of time between the appearance of two adjoining bits of the pulse-code modulated signal. In this way, the voltage picked up from the RC network at a sampling instant which, from the last bit of the pulse-modulated signal, has the same time interval as two neighboring bits of the signal concerned at a time represents the analog signal corresponding to the pulse-code modulated signal, which is a digital signal.

This prior art decoder permits the conversion of the serial bits of a digital signal to an analog signal, whereby the bits concerned must appear with increasing significance. However, by means of the prior art decoder, it is not possible, without further provisions, to convert digital signals to analog signals by using a non-linear characteristic such as is frequently employed in PCM decoders and coders.

It is, therefore, an object of the invention to provide a digital-to-analog converter with a non-linear characteristic comprising $2^{m+1}$linear segments and to use a Shannon decoder therein for the conversion of digital signals to analog signals.

SUMMARY OF THE INVENTION

In accordance with the invention, the foregoing and other objects are achieved in a network of the type discussed hereinabove which uses a Shannon decoder with an RC network comprising a parallel-connected capacitor and a resistor. The capacitor can be charged at timing instants fixed by clock pulses according to the binary 1 bits of the digital signal, and after taking into account the suitable bits of the digital signal can be connected to a decoder output. Starting from the lowest-order bit of the digital signal the capacitor of the RC network is charged with a constant current at n consecutive timing instants by the $n$ binary 1 lowest-order bits of the digital signal.

At a timing instant immediately following the n consecutive timing instants, the capacitor of the RC network is charged with a constant current in the event that at least one of the $m$ bits of the digital signal immediately preceding the $n$ bits in rank is a binary 1. The voltage applied at the capacitor of the RC network is fed to the decoder output at a timing instant of $2^m - 1$ consecutive timing instants fixed by the $m$ binary 1 bits of the digital signal.

The invention has the advantage that it can be constructed with very little technical effort for converting digital signals comprising n+m+1 bits each into analog signals, whereby use is made of a non-linear characteristic that meets the CCITT conditions referenced above.

According to an advantageous development of the invention, there is provided a shift register having $2^m + n$ register stages connected in series. At its output, the shift register is connected at the RC network and which in the neighboring register stages thereof on the input side is driven into the set state by the $n$ binary 1 bits of the digital signal. The register stage adjoining the n register stages is driven into the set state in the event that at least one of the m bits of the digital signal is formed by a binary 1. Of the remaining $2^m - 1$ register stages of the shift register one register stage determined by the $m$ binary 1 bits of the digital signal can be driven into the set state, whereby the register stage disposed farthermost from the n+1 register stages can be controlled into the set state in the event that no bit or the lowest-order bit of the m bits of the digital signal is formed by a binary 1. The capacitor of the RC network can be charged by the output signals in the $n + 1$ register stages, and is connected with the decoder output by the output signal of the register stage of the $2^m - 1$ register stages which is in the set state. As a result, the digital-to-analog converter can be given a highly simple network configuration.

According to another advantageous development of the invention, two two-input AND elements are connected with one input each to the output of the shift register. Furthermore, the outputs of the AND elements are connected to the operating inputs of two switches, of which one is disposed intermediate a constant-current pulse generator and the RC network and the other intermediate the RC network and the decoder output. The AND element, which is capable of operating the switch disposed intermediate the constant-current pulse generator and the RC network, receives release signals at the other input thereof from a pulse distributor connected to the constant-current pulse generator during the first $n + 1$ clock pulses of a clock pulse period comprising $n + 2^m$ consecutive clock pulses, while $2^m - 1$ consecutive clock pulses are fed to the AND element provided for the operation of the other switch at the other input thereof during the remaining portion of the clock pulse period concerned. This results in a relatively simple circuit design for the circuit element pertaining to the Shannon decoder proper.

According to another advantageous development of the invention, the pulses generated by the constant-current pulse generator are fed to a shift input of the shift register, thereby assuring in a relatively simply way that the charging of the capacitor of the RC network and the connection thereof with the decoder output synchronize with a desired shifting of the register contents of the shift register.

According to another advantageous development, the polarity of the constant current generated by the constant-current pulse generator is fixed by the remaining one bit of the digital signal. In this way, it is possible to transmit from the digital-to-analog converter signals with the polarity that is suitable in each particular case.

According to still another advantageous development of the invention, a changeover stage is inserted intermediate the RC network and the decoder output which generates the signal routed thereto with either one or the other polarity as a function of the remaining one bit of the digital signal. Thus, a constant current of one polarity can be employed, which is of advantage in the event that a constant-current pulse generator is available having only one polarity.

BRIEF DESCRIPTION OF THE DRAWINGS

The principles of the invention will be more readily understood by reference to the description of preferred embodiments given hereinbelow in conjunction with the accompanying drawings.

DETAILED DESCRIPTION OF THE DRAWINGS

Figure 1:
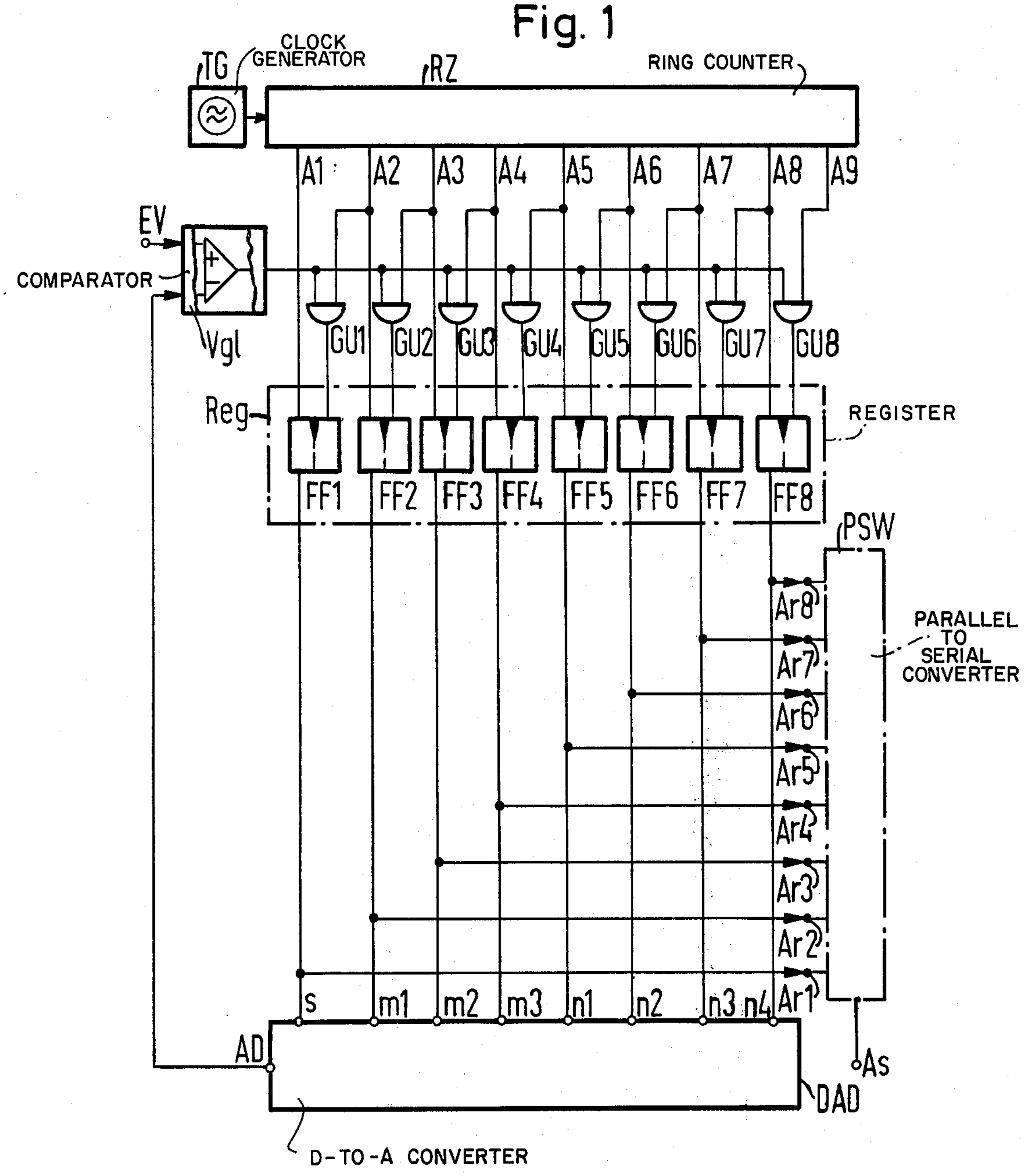
FIG. 1 shows a block diagram of a coder operating according to the iterative process, wherein the digital-to-analog converter proposed by the invention can be employed.

The coder operating according to the iterative process and illustrated in FIG. 1 contains an input stage formed by a comparator Vgl to which are routed analog input signals being converted into digital signals. The comparator Vgl is a comparator of known construction working in analog fashion, which compares the analog input signal at the input EV with an analog signal fed thereto at another input (not designated). Eight AND elements GU1-8 are connected with one input each to the output of the comparator Vgl. The other inputs of the AND elements GU1 to GU8 are connected to outputs A2-9 of a ring counter RZ, which is driven by a clock generator TG, such that it generates a signal one after another at the outputs thereof.

The outputs of the AND elements GU1 to GU8 are connected to reset inputs of flip-flops that form a register Reg, viz. FF1-8. The setting inputs of the flip-flops FF1 to FF8 are connected to the outputs A1 to A8 of the ring counter RZ. The inputs $s$, $m1$ to $m3$, $n1$ to $n4$ of a digital-to-analog converter DAD are connected to the outputs of the flip-flops FF1 to FF8 associated with the setting inputs. One output AD of the digital-to-analog converter DAD is connected to the other input of the comparator Vgl. The inputs Ar1 to Ar8 of a parallel-serial converter PSW are connected to the outputs of the flip-flops FF1 to FF8. As will be explained hereinbelow, there appear at the inputs Ar1 to Ar8, after each cycle of the ring counter RZ, the bits of a digital signal corresponding to the analog signal appearing at the input EV. The parallel-serial converter PSW is capable of transmitting as serial bits the bits that are routed thereto from an output As in substantially parallel fashion. For this purpose, the output As of the parallel-serial converter could be connected to all the inputs Ar1 to Ar8 of said parallel-serial converter PSW, in this case over decoupling switching means, such as diodes.

After the above description of the construction of the coder depicted in FIG. 1, its mode of operation will now be discussed. Let it first be assumed that all the flip-flops FF1 to FF8 are in the reset stage, in which a binary 0 is transmitted from their outputs as wired in FIG. 1. It is now assumed that an analog input signal is applied at the input EV and that the clock generator TG transmits clock pulses to the ring counter RZ, which can be in such a position that a signal appears at the output A1 with the appearance of the first clock pulse from the clock generator TG. This signal causes the setting of the flip-flop FF1. This, in turn, causes the routing of a 1 bit to the input $s$ of the digital-to-analog converter DAD, whereupon a corresponding analog signal is transmitted to the comparator Vgl from the output AD of said converter DAD.

In the comparator Vgl the analog signal is compared with the analog input signal still applied at the input Ev. As a result of the comparison, an output signal can be transmitted which indicates that the analog input signal applied at the other input of the comparator Vgl. Thereupon, with the appearance of the next signal from the ring counter RZ, i.e., a signal at the output A2 of the ring counter RZ, the AND element GU1 cannot be enabled for transmission, so that the flip-flop FF1 remains set. Moreover, the flip-flop FF2 is set by the signal now appearing at the output A2 of the ring counter RZ. In this way, an additional 1 bit is routed to the input $m1$ of the digital-to-analog converter DAD.

Figure 2:
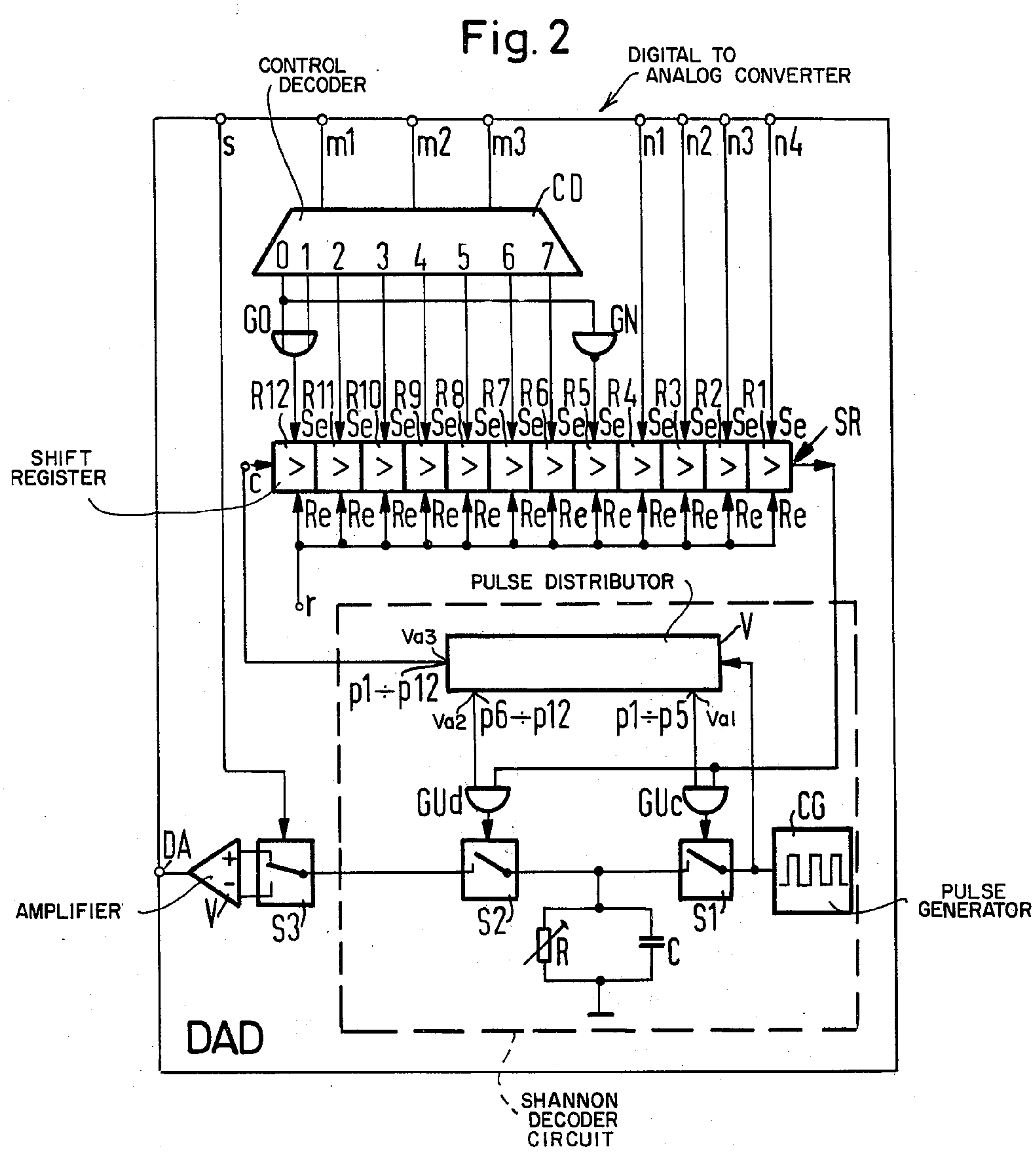
FIG. 2 shows a form of construction of the digital-to-analog converter according to the invention.

FIG. 2 details a form of construction, according to the invention, of the digital-to-analog converter DAD depicted in FIG. 1. Like the digital-to-analog converter of FIG. 1, the digital-to-analog converter DAD of FIG. 2 has inputs $s$, $m1$ to $m3$, $n1$ to $n4$. There appear at these inputs, in the sequence indicated and with decreasing order, the $1 + m + n$ bits of the digital signal (where $m = 3$ and $n = 4$). This means that the $n$ bits are the bits of the digital signal with the lowest order, and the $m$ bits adjoining the $n$ bits precede in order the $n$ bits in question. Here, the remaining one bit of the digital signal has the highest order of the digital signal.

The digital-to-analog converter DAD includes a shift register SR having twelve serially connected register stages R1 to R12, whose register stages are driven, at their setting inputs, by the $n + m$ bits of the digital signal. The setting inputs Se of the register stages R1 to R4 of the shift register SR, i.e., the neighboring register stages of the shift register disposed on the output end of the shift register, are connected to the inputs $n4$, $r3$, $n2$, or $n1$ of the digital-to-analog converter DAD. The setting input Se of the register stage R5 adjoining the four register stages R1 to R4 is connected to the output of a NOT element GN leading to an output 0 of a control decoder which is connected on the input side at the inputs $m1$, $m2$, and $m3$ of the digital-to-analog converter DAD, and to which the $m$ bits of the digital signal are routed over the inputs. As apparent from the drawing, the control decoder CD has further outputs 1 to 7, in addition to the output 0 mentioned above, of which the outputs 7, 6, 5, 4, 3, and 2 are each directly connected to a setting input Se of one of the register stages R6 to R11 of the shift register SR that adjoing the register stage R5 last mentioned. Together with the output 0 of the control decoder CD, the output 1 of the control decoder CD is connected to the setting input Se of the last register stage R12 of the shift register SR over an OR element GO. The importance of the OR element GO and of the NOT element GN will be explained hereinbelow.

Each of the register stages R1 to R12 of the shift register SR further has a separate resetting input Re. The resetting inputs of all the register stages R1 to R12 of the shift register SR are jointly connected to a switching point $r$, to which can be routed a reset pulse designed to reset all the register stages R1 to R12 of the shift register SR. It is to be noted in this connection that in the operating mode of the digital-to-analog converter DAD illustrated in FIG. 2 and to be explained in detail hereinbelow, one can do without such a resetting, since in a conversion procedure the shift register SR is always energized with a number of shift pulses corresponding to the number of register stages thereof. Thus, after each shift cycle, all the register stages R1 to R12 of the shift register SR are reset.

The output of the register stage R1 disposed at the output end of the shift register (not shown) is connected to one end each of two AND elements GUc and GUd, which are each provided with an additional input. The additional input of the two AND elements GUc and GUd are connected to outputs Va1, Va2, of a pulse distributor D of known construction, one input of which is connected to the output of a constant-current pulse generator CG. Further connected to the output of the constant-current pulse generator CG is the end of a switch S1, to the other end of which another switch S2 is connected with one end.

The operating input of the switch S1 is connected to the output of the AND element GUc and the operating input of the switch S2 is connected to the output of the AND element GUd. To the junction point of said one end of the switch S2 and said end of the switch S1 is connected an RC network comprising a capacitor C and a resistor R connected in parallel therewith, which resistor R may be adjustable in the present case. The last-mentioned element comprising the RC network, the two switches S1 and S2, the two AND elements GUC and GUd, as well as the constant-current pulse generator CG and the pulse distributor D represents a Shannon decoder circuit.

With regard to the pulse distributor D, it is to be noted that one output Va3 thereof is connected to a shift input c of the shift register SR. The contents of all the register stages R1 to R12 of the shift register SR are shifted by pulses routed to the shift input $c$ of the shift register SR.

The input of a changeover switch S3 is connected with the other end of the switch S2, not discussed heretofore, whose two outputs are connected to two separate inputs (+) and (−) of an amplifier V, which is connected at its output to the decoder output DA of the digital-to-analog converter DAD. The changeover switch S3 which, like the other two switches S1 and S2, may be formed by an electronic switch, is connected with its operating input to the input s of the digital-to-analog converter DAD. The remaining one bit of the digital signal is routed to the input $s$ and determines the polarity of the analog signal transmitted from the digital-to-analog converter DAD at any given moment.

After the above discussion of the construction of the digital-to-analog converter DAD, its operation will be discussed. Let it be assumed that all the register stages R1 to R12 of the shift register SR are in the reset stage. The register stages R1 to R4 are set according to the $n$ binary 1 bits of the digital signal concerned appearing at the inputs $n1$ to $n4$. Which of the remaining register stages R5 to R12 of the shift register Sr are set depends on whether, and in some circumstances which, bits of the m bits of the digital signal appearing at the inputs $m1$, $m2$, and $m3$ are formed by a binary 1. If it is assumed that no binary 1 is applied at any one of the inputs $m1$, $m2$, and $m3$, then the control decoder CD transmits a 1 signal from its output 0, by which the register stage R12 of the shift register SR is set. If a binary 1 appears at least in one of the inputs $m1$, $m2$, and $m3$, then the control decoder transmits at any one of its outputs 1 to 7 and, therefore, at the setting input Se of one of the register stages R6 to R12, a 1 signal and, in addition, a 1 signal is routed from the NOT element GN to the setting input Se of the register stage R5 of the shift register, so that the register stage R5 concerned is set.

After the register stages of the shift register SR have been set according to the $n+m$ binary 1 bits of the digital signal a shift process is initiated by which the contents of the shift register SR are shifted out of the latter. For this purpose, the pulses generated by the constant-current pulse generator CG are utilized, whereby one pulse period comprises twelve consecutive (i.e., $n+2^m$) pulses generated by the constant-current pulse generator CG. As indicated by the expression in parentheses $p1+p12$ in FIG. 2, at the output Va3 of the pulse distributor D, all the pulses of a pulse period comprising 12 ($=n+2^m$) consecutive pulses are fed to the shift input $c$ of the shift register SR. By contrast, only the first five pulses ($p1+p5$) of the 12 pulses of a pulse period appear at the output Va1 of the pulse distributor D. The other seven pulses ($p6+p12$) of the 12 pulses of the pulse period in question appear at the output Va2 of the pulse distributor D. Due to the pulses thus appearing at the outputs Va1 to Va3 of the pulse distributor D, the switch S1 is closed during the appearance of each of said first five pulses $p1+p5$ if, in addition, at the instant concerned the corresponding register stage of the register stages R1 to R5 of the shift register SR is set. If the switch S1 is closed, the capacitor C of the RC element comprising it and the resistor R is charged by a constant-current pulse transmitted at the same instant from the constant-current pulse generator CG. The RC time constant of the RC network is determined or set by the resistor R in such a way that after the lapse of the period between the appearance of two consecutive constant-current pulses of the constant-current pulses produced by the constant-current pulse generator CG, the voltage applied at the capacitor C of the RC network at the start of said period has dropped to half its initial value.

The switch S2 is closed with the appearance of a 1 signal at the output of the shift register SR at an instant when one of the remaining ($2^m - 1 =$) seven pulses ($p6 + p12$) of the pulse period comprising ($n + 2^m$) 12 pulses appears at the output Va2 of the pulse distributor D. The 1 signal appearing at the output of the shift register SR at the instant in question corresponds to the set state of one of the $2^m - 1$ register stages R6 to R12 of the shift register SR. The RC network is connected to the output DA over the changeover switch S3 and the amplifier V, due to the closing of the switch S2. This means that at the time of closure of the switch S2 the analog voltage corresponding in amplitude to the $n + m$ bits of the digital signal concerned is routed to the output DA, whereby either one or the other polarity is provided to the output signal by the changeover switch S3 and the amplifier V, depending on whether the remaining one bit of the digital signal concerned appearing at the input s of the digital-to-analog converter DAD is a binary 1 or a binary 0.

Due to its design and mode of operation, the digital-to-analog converter DAD described hereinabove has a non-linear characteristic comprising $2^{m+1} = 16$ linear segments with $2^n = 16$ amplitude stages each. By setting the adjacent register stage R5 adjoining the $n = 4$ neighboring register stages R1 to R4 of the shift register at the output in the event that at least one of the m bits is formed by a binary 1, a voltage is added to the voltage applied at the capacitor C of the RC network. This assumes one starts from the original $2^{m+1}$ available linear segments of the characteristic, from the originally second linear segment of that characteristic and from the origin of coordinates of the coordinate system in which the characteristic in question is situated. As a result of the added voltage the originally second linear segment of the characteristic follows immediately the originally first segment of the characteristic. Since the register stage R12 of the shift register SR is triggered from the two outputs 0 and 1 of the control decoder CD over the OR element GO, the two first segments at both sides of the origin of coordinates of the coordinate system in which the characteristic is situated form together only on single linear segment. The other linear segments of the characteristic, thus formed, and running through the origin of coordinates of said coordinate system immediately follow the other linear segments of the characteristic in such a way that the slopes differ from one another by the factor 2, so that, in fact, only 13 linear segments are available.

The preferred embodiment described hereinabove is intended only to be exemplary of the principles of the invention. It is contemplated that various changes to or modifications of the described embodiment can be made, while remaining within the scope of the invention, as defined by the appended claims.

I claim:

1. In a digital-to-analog converter for converting digital signals comprising $n + m + 1$ bits each to analog signals with a non-linear characteristic comprising $2^{m+1}$ linear segments having $2^n$ amplitude stages each for use with a coder, whereby the amplitude of the corresponding analog signal is determined by the n+m bits of the digital signal and the polarity of the analog signal by the remaining one bit, the improvement comprising:

a Shannon decoder circuit including RC network having a resistor and capacitor connected in parallel, clock pulse generator means, means for charging said capacitor with a constant-current at times determined by the output of said clock pulse generator means and according to the binary one bits in said digital signal, and means for connecting said RC network to an output of said converter starting from the lowest order bit of said digital signal, said capacitor being charged at $n$ consecutive timing instants by the $n$ binary one lowest order bits of said digital signal, said means for charging being operable to additionally charge said capacitor at a time immediately following said $n$ consecutive timing instants in the event that at least one of the $m$ bits of said digital signal immediately preceding said $n$ bits in rank is a binary one, the voltage appearing across said capacitor being coupled to the converter output at the time corresponding to $2^m - 1$ consecutive instants determined by the $m$ binary one bits of said digital signal, and that the voltage applied at the capacitor (c) of the RC network is routed to the decoder output at a timing instant of $2^m - 1$ consecutive timing instants fixed by the $m$ binary -"1" bits of the digital signal concerned.

2. The converter as defined in claim 1 further comprising:

shift register means comprising $2^m + n$ serially connected register stages, said shift register being connected at its output to said RC network and which in the $n$ neighboring register stages thereof adjacent the input is controlled into the set state by the $n$ binary-"1" bits of the digital signal, a register stage adjoining said $n$ register stages in said shift register being driven into the set state in the event that at least one of the m bits of the digital signal is a binary one, in the remaining $2^m - 1$ register stages of said shift register one register stage determined by the m binary one bits of said digital signal being driven into the set state, whereby the register stage disposed farthermost from the $n + 1$ register stages can be driven into the set state in the event that no bit or the lowest-order of the $m$ bits of the digital signal is formed by a binary one, and wherein said capacitor is charged by the output signals in the n+1 adjoining register stages and is connected to said converter output by the output signal of the register stage of the register stages which is in the set state.

3. The converter as defined in claim 2 wherein at the output of said shift register two, 2-input AND elements are connected with one input each, the outputs of said AND elements being connected to the operating inputs of two switches, of which one is disposed intermediate a constant-current pulse generator and said RC network, and the other intermediate said RC network and said converter output, and wherein the AND element which is capable of operating the switch disposed intermediate said constant current pulse generator and said RC network receives release signals at the other input thereof from a pulse distributor connected to said constant-current pulse generator during the first $n + 1$ clock pulses of a clock pulse period comprising $2^m + n$ consecutive clock pulses, while $2^m - 1$ consecutive clock pulses are coupled to the AND element provided for the operating of the other switch at the other input thereof during the remaining portion of the clock pulse period concerned.

4. The converter as defined in claim 3, wherein the pulses generated by said constant-current pulse generator are coupled to a shift input of said shift register.

5. The converter as defined in claim 1 further comprising:

means for setting the polarity of said constant current in accordance with the value of the remaining bit of said digital signal.

6. The converter as defined in claim 1, further comprising:

a changeover stage inserted intermediate said RC network and said converter output which generates the signal routed thereto with either one or the other polarity as a function of the remaining one bit of said digital signal.

7. The converter according to claim 1 wherein said coder comprising a coder operating according to the iterative process.

* * * * *